United States Patent [19]

Lévy

[11] 4,117,913
[45] Oct. 3, 1978

[54] PROCESS AND MACHINE FOR SMOOTHING PRINTED WIRING-CIRCUIT PLATES

[75] Inventor: Julienne Lévy, Saint Louis, France

[73] Assignee: Telettra International, Luxembourg, Luxembourg

[21] Appl. No.: 740,820

[22] Filed: Nov. 11, 1976

[30] Foreign Application Priority Data

Nov. 24, 1976 [FR] France .............................. 75 35787

[51] Int. Cl.² .......................... B23C 3/13; B23C 3/12; B23Q 1/18
[52] U.S. Cl. ..................................... 90/15.1; 90/21 D
[58] Field of Search .................. 90/11 R, 11 C, 15 R, 90/18, 15.1, DIG. 2, 21 D; 51/35, 34 D, 45; 83/397; 144/122; 29/564.7, 564.8; 269/234; 408/130

[56] References Cited

U.S. PATENT DOCUMENTS

| | | | |
|---|---|---|---|
| 3,091,137 | 5/1963 | Aronson | 408/130 X |
| 3,172,652 | 3/1965 | Zapf | 269/234 X |
| 3,783,741 | 1/1974 | Schadebrodt et al. | 90/15 R X |

FOREIGN PATENT DOCUMENTS 664,173  6/1963  Canada ....................................... 83/397

*Primary Examiner*—Horace M. Culver
*Attorney, Agent, or Firm*—Burgess, Ryan and Wayne

[57] ABSTRACT

This invention concerns a machine for smoothing printed-circuit plates.

In this machine, the plate is made to perform several transverse movements in relation to the lengthwise axis of the plate; at the end of each such transverse movement, the smoothing tool is made to perform an alternating lengthwise movement, covering a distance slightly greater than the length of the plate; each such lengthwise movement in one direction corresponds to a transverse movement with an uneven ordinal number, while each lengthwise movement in the opposite direction corresponds to a transverse movement with an even ordinal number; at the end of the final lengthwise movement, the plate is ejected, upon which the device that had moved the plate performs a backward movement to its original position.

This machine is used in the manufacture of printed circuits.

1 Claim, 4 Drawing Figures

PROCESS AND MACHINE FOR SMOOTHING PRINTED WIRING-CIRCUIT PLATES

This invention concerns a machine to smooth printed wiring-circuit plates, and particularly rheophores or conductors projecting beyond the surface of such plates. More specifically, it concerns a process in which the printed-wiring plate to be smoothed is subjected to several movements in an orthogonal direction in relation to the lengthwise axis of the plate, while at the end of each transverse movement of the plate the smoothing tool performs several back and forward movements along the lengthwise axis of the plate.

The machine to carry out this process comprises a device to shift the plate transversely, a smoothing device, a device to impart back and forward movements to the smoothing device along the lengthwise axis of the plate, and a device for automatic coordination of plate movements and smoothing device movements.

Printed-circuit plates undergo a smoothing operation, to reduce and equalize the distance by which conductors project from the appropriate side of the plate. In one of the most advanced smoothing processes, a smoothing unit is used, located between a waxing unit and a soldering unit. These three units are installed together on a standard ultrasonic welding device, such as a Hollis machine. Machining is carried out on conductors of relevant components when these are fixed to the plate with a wax. Three circular milling-cutters are used for this purpose, covering together and simultaneously the whole plate surface. The set of cutters is stationary, in other words it undergoes no lengthwise or transverse travelling movement. The plate, on the other hand, is in continuous movement in relation to the cutters.

This existing process, and devices for applying it, involve several drawbacks, in particular:
1. The operation for fitting components to the plate is quite complicated, since the conductors used are rather short.
2. Smoothing of conductors is done after fixing them with a wax, but before they are soldered; this often means the loss of conductors, because components may be raised during the soldering operation.
3. In existing processes, it is not possible to reduce the amount of conductors project on the soldered side below certain levels and so far these are quite high, for example more than 1.6 mm. This is a considerable disadvantage, in view of the current tendency to miniaturize electronic circuits more and more, to reduce the overall dimensions of the equipment in which they are used, so that the purely mechanical limitation on the reduction of the height of projection of the conductors project is a considerable drawback. Consequently, not only are the efforts made in the electronics field to reduce the size of equipment—which often raise difficult problems—made ineffective, but there is also the risk of meeting considerable obstacles in trying to produce new generations of transmission systems. For example, new digital transmission systems, using MIC signals, allow considerable reductions from the electronic viewpoint in the number and/or size of components, and should accordingly produce a proportional reduction in overall size. And yet there is no doubt that this overall reduction may be impossible if manufacturers cannot overcome the drawback of over-pronounced, uneven projection of conductors from printed-circuit plates.

The purpose of this invention is to provide a process that overcomes the drawbacks of existing processes, allowing the height of projection of the conductors from a printed-circuit plate to be reduced to a very low level, compatible in all cases with miniaturization requirements involved in the creation of new generations of circuits, such as digital data-transmission circuits.

Another purpose of the invention is to provide a process that allows conductors on printed-circuit plates to be smoothed down after soldering of components.

Yet another purpose of the invention is to provide a compact, economical and automatic machine to carry out this novel process.

In the process according to the invention, a printed-circuit plate is smoothed by means of at least one smoothing tool by subjecting the plate to transverse movements, while the smoothing tool is subjected to a lengthwise movement on completion of every transverse movement of the plate.

One important feature of the invention is that smoothing is now done on the plate after the soldering operation, the plate being fitted with long conductors which project beyond the plate.

The machine according the invention for carrying out the above defined process comprises at least one smoothing tool consisting of a milling-cutter revolving at high speed, and means for moving the printed-circuit plate, said machine further comprising:
1. a device to move the plate in a transverse direction in relation to the lengthwise axis of the plate, and in the same plane as the plate,
2. a device to impart a translational travelling movement to the smoothing tool along the lengthwise axis of the plate,
3. a control device combined with the plate-moving device, to control transverse movements of the plate and initiate the lengthwise movement of the smoothing tool on completion of each movement of the plate,
4. actuating means adapted to be actuated on completion of this lengthwise movement, cousing a second transverse movement of the plate and a second lengthwise movement of the smoothing tool on completion of the second transverse movement of the plate, this lengthwise movement of the smoothing tool taking place in the direction opposite to that of the previous lengthwise movement,
5. means for placing the plate on the transverse-movement device, closing the machine hermetically, blocking the plate in position and starting up the first transverse movement of the plate,
6. means for causing the components forming the plate-moving device to return to their original position on completion of partial transverse movements, and.
7. means for blocking the whole machine to prevent accidents.

It will be easier to understand the invention from the following detailed description, illustrated by the accompanying figures, representing various embodiments of the invention, which is naturally in no way confined to such embodiments.

FIG. 1 shows, drawn in continuous lines, a rectangular plate PCS with lengthwise sides $L_i$ and $L_e$ and small or transverse sides $M_1$ and $M_2$.

The plate PCS (drawn with continuous lines) occupies an initial position O, which is its position before the smoothing operation begins.

Figure 2:
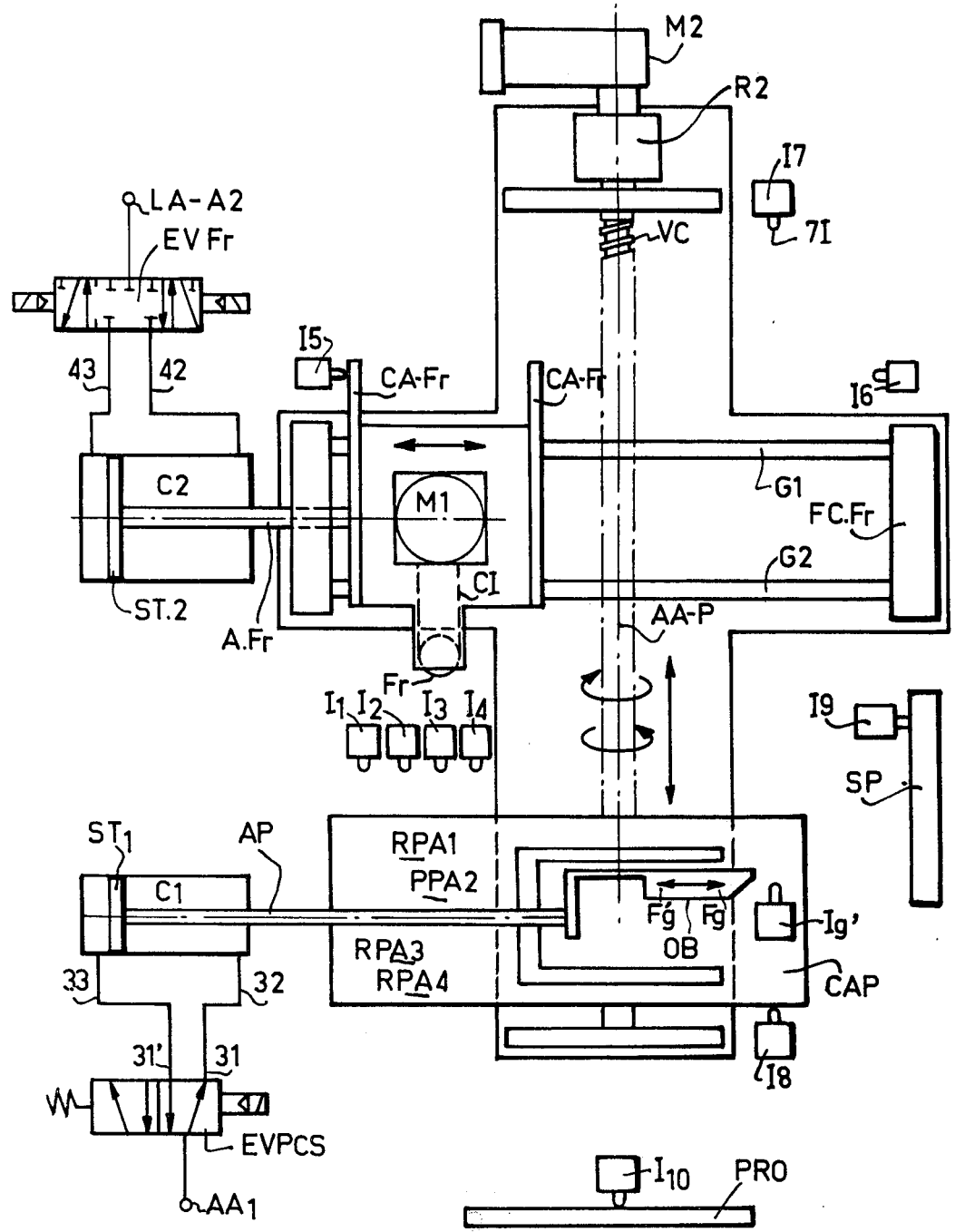
FIG. 2 shows, in diagrammatical form, the machine performing the novel process.

In this position O, the plate rests on a moving device (CA.P on FIG. 2). When the machine is switched on, the plate undergoes a transverse movement, as shown by the arrow 1°, into position I, in which the inner lengthwise side $L_i$ is in the position $L'_i$.

At the end of movement of the plate between position O and position I, the smoothing tool Fr, a milling-cutter revolving at high speed, is subjected to a lengthwise movement parallel to the lengthwise axis X—X of the plate. This means that in passing from position A to position B, the cutter Fr moves over the strip between the broken lines 10 and 11, which are equidistant from D, in other words at a distance from each other equal to the outside diameter of the cutter Fr. When the cutter has reached position B, the plate is subjected to a second movement, as indicated by arrow 2°. This brings the upper side $L_i$ into the position $L''_i$.

At the end of this movement, when the plate has reached position II, the milling-cutter Fr performs a backward movement ELR1, moving over the strip between the broken lines 12 and 13, the distance D between which is equal to the diameter of the cutter Fr.

When lengthwise movement of the milling-cutter Fr is completed, and the cutter is in position A' (preferably coinciding with the original position A), the plate is moved for the third time, in the direction indicated by arrow 3° in a transverse direction, into position III.

At the end of this movement of the plate, the cutter Fr moves forward in the direction ELA2, from position A' to position B'', thereby smoothing the strip between broken lines 14 and 15.

When the cutter Fr has reached position B'', its lengthwise movement ends, and the plate moves transversely for the fourth time, in the direction indicated by arrow 4°, into position IV. At the end of this movement, the milling-cutter Fr begins its final backward movement ELR2, from position B'' to position A''', thereby smoothing the last strip between broken lines 16 and 17.

This means that the whole plate has been smoothed. The smooth plate PCSR (drawn in continuous lines) is then ejected by the machine, moving from position IV to position V. The plate-moving device (CA.P in FIG. 2) now performs a backward movement over a distance equal to the sum of the four forward movements shown by arrows 1°, 2°, 3° and 4°, previously made by the plate. The arrow 5° shows this return movement of the plate-moving device CA.P from its final position $OT_F$ to its original position $OT_I$.

In this description of the process, given merely as an example, there are four identical forward movements of the plate (1°, 2°, 3° and 4°) and a single backward movement (5°), and two back and forward movements (ELA1 and ELA2, and ELR1 and ELR2) of the milling-cutter Fr. The number of movements can naturally be different, the main and novel result remaining that they make it possible:

1. to reduce the distance conductors project from the plate, to well below the levels possible with existing processes, and more specifically to less than 1.8 mm, and 2. to perform the process with a simple, economical, compact, reliable and efficient machine.

FIG. 2 provides a diagrammatical view of this machine.

The machine comprises a device CA.P to move the plate PCS (not shown here). This device preferably consists of a carriage. The device CA.P is connected to a rod AP moved by the piston $ST_1$ of a jack $C_1$, supplied with pressure fluid through two passages 32 and 33 by means of pipes 31 and 31', controlled respectively by an electrovalve EV.P. The pressure fluid A.A comes from the feed-pipe LA A1 connected to an appropriate source (not shown here).

In an orthogonal position in relation to the rod AP the carriage CA.P is connected to a forward shaft AAP, at the other end of which is an endless screw VC, driven by a motor-reducing unit $M_2$-$R_2$. This unit is connected to a limit microswitch 17. Another limit microswitch 18 is situated at the starting position of the carriage CA.P. The carriage CA.P contains contact studs R.PA1, R.PA2, R.PA3 and R.PA4, staggered in relation to one another and materializing respective reference points. Microswitches corresponding to intermediate positions of the carriage CA.P, represented diagrammatically by I.1, I.2, I.3 and I.4, correspond to these reference points.

Movements of the milling-cutter Fr are obtained by means of a motor M1, which causes the cutter to rotate at very high speed by means of a belt CI. The cutter Fr, motor $M_1$ and transmission system CI are placed on a lengthwise-movement device, consisting for example of a carriage CA.Fr, which is moved along rails G1 and G2, and operated by a rod A.Fr connected to the piston ST2 of a jack $C_2$, preferably a pneumatic jack, which is supplied with pressure fluid from the outside pipe LA A2, fed from an appropriate source (not shown here), through the electrovalve EV.Fr and pipes 42 and 43. Limit microswitches I.5 and I.6 are provided for the carriage CA.Fr.

A machine-closing device SP consists of a door providing access to the plate, and is preferably in the form of a gate for which a microswitch I.9 is provided.

The machine also has a microswitch I.10 to block the protective cover of the machine.

This machine operates as follows.

In the position shown in FIG. 2, the machine is in the "off" position, in other words ready to start up. The operator opens the gate SP, inserts a plate for smoothing and closes the gate tightly. When it is closed, it sets off the microswitch I.9. This in turn operates a locking device OB, which grips the plate automatically. As will be better understood later, the operator, to facilitate operations, simply places the unsmoothed plate on a slightly sloping surface; in this way, blocking or fixing of the plate to its carriage CA.P is produced automatically by the microswitch I.9 when the gate SP, by acting on the electrovalve EV.PCS and exciting it so that is moves from position 31 to position 31', causes pressure fluid (compressed air) to be admitted into the cylinder $C_1$ through pipe 33, so that the piston $ST_1$ moves to the right and the rod AP connected to this piston also moves the locking device OB to the right (along the direction shown by the arrow F9) thereby locking the plate in position.

When the locking device OB moves to the right, the microcontactor I.9' on the carriage CA.P closes, thereby starting up the motor-reduction unit $M_2$-$R_2$, which starts the screw VC, and consequently the shaft AAP, revolving in an anticlockwise direction, in order to produce the first movement of the carriage CA.P. This first movement stops when the stud R.PA 1 comes into contact with microswitch I.1. This causes:

1. discontinuation of the rotation of the screw VC and consequently movement of the carriage CA.P;
2. starting of the motor M which imparts a fast rotary movement to the cutter Fr by means of the belt Cl;
3. energisation of the electrovalve EV.Fr, so that compressed air is admitted through passage 43 into cylinder $C_2$, making the piston $ST_2$ move to the right, to the opposite end of the cylinder $C_2$, so that the rod AFr pushes the whole carriage CA.Fr to the other end of rails $G_1$ and $G_2$, to position FC.Fr, corresponding to the end of movement of the cutter Fr.

Figure 1:
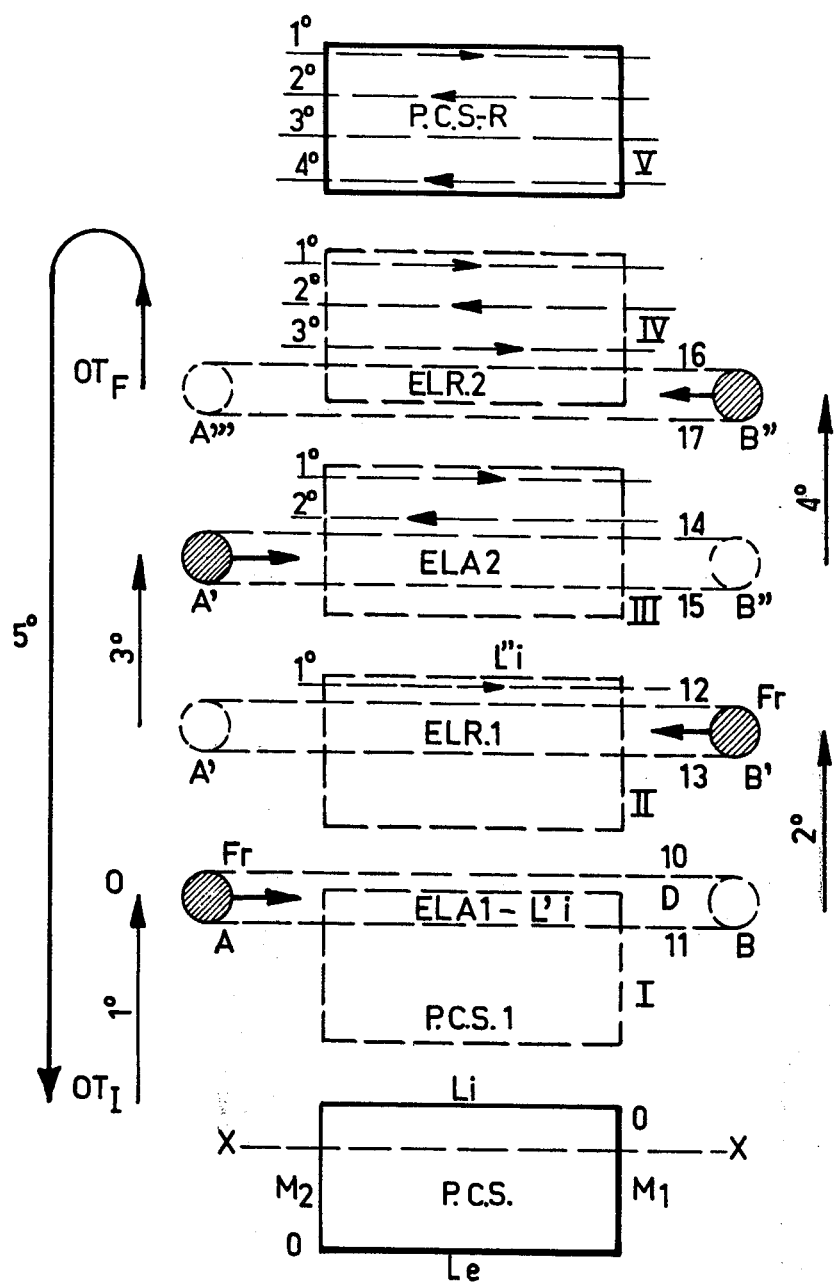
FIG. 1 shows the novel process in diagrammatical form.

When the carriage CA.Fr reaches its end position EC.Fr, it comes into contact with the microswitch I.6 which (in the same way as microswitch I.9') starts up the motor-reduction unit $M_2$-$R_2$. This causes the screw VC to revolve, moving the carriage CA.P with the plate. This second movement stops when the stud RPA2 touches microswitch I.2, which repeats the operations performed by contactor I.1, in other words it energizes the electrovalve EV.Fr so that compressed air or a similar fluid is admitted into the cylinder $C_2$ through the passage 42, moving the piston $ST_2$ to the left and the cutter Fr in a reverse direction (ELR1 on FIG. 1). At the end of this backward movement, the carriage CA.Fr with the cutter engages microswitch I.5. This blocks the carriage CA.Fr while allowing the motor-reduction unit $M_2$-$R_2$ to rotate the screw VC in such a way that the carriage CA.P with the plate performs its third movement, which stops when the stud RP.A3 engages microswitch I.3. This microswitch re-energizes the electrovalve EV.Fr, so that compressed air is admitted into the cylinder $C_2$ through passage 43, causing the carriage CA.Fr to perform its second movement in the direction ELA2 until it engages microswitch I.6. This microswitch stops the carriage CA.Fr and restarts the motor-reduction unit $M_2$-$R_2$, producing the fourth transverse movement of the carriage CA.P. This movement stops when the stud RPA4 engages microswitch I.4. This microswitch re-energizes the electrovalve EV.Fr, so that compressed air is admitted into the cylinder $C_2$ through passage 42. The carriage CA.Fr bearing the cutter performs its second backward movement in the direction ELR2. The plate PCS is now completely smoothed. It will be noted that this smoothing process is performed in a completely automatic manner.

When the carriage CA.P has completed its fourth movement, the microswitch I.7 is also closed. This microswitch starts up the motor-reduction unit $M_2$-$R_2$, causing it to rotate the screw VC in the opposite direction (in other words in a clockwise direction), in order to bring the carriage CA.P back to its original position in a single movement and in minimum time (direction 5° in FIG. 1). This movement corresponds to the sum of the four partial movements described above, the carriage carrying the plate being moved from its final position $OT_F$ to its original position $OT_I$ (in FIG. 1).

As already mentioned above, the tenth microswitch I.10 is provided only for security, to block the machine in the event of an accident and prevent it from functioning while it is under repair, or in similar circumstances.

Figure 3:
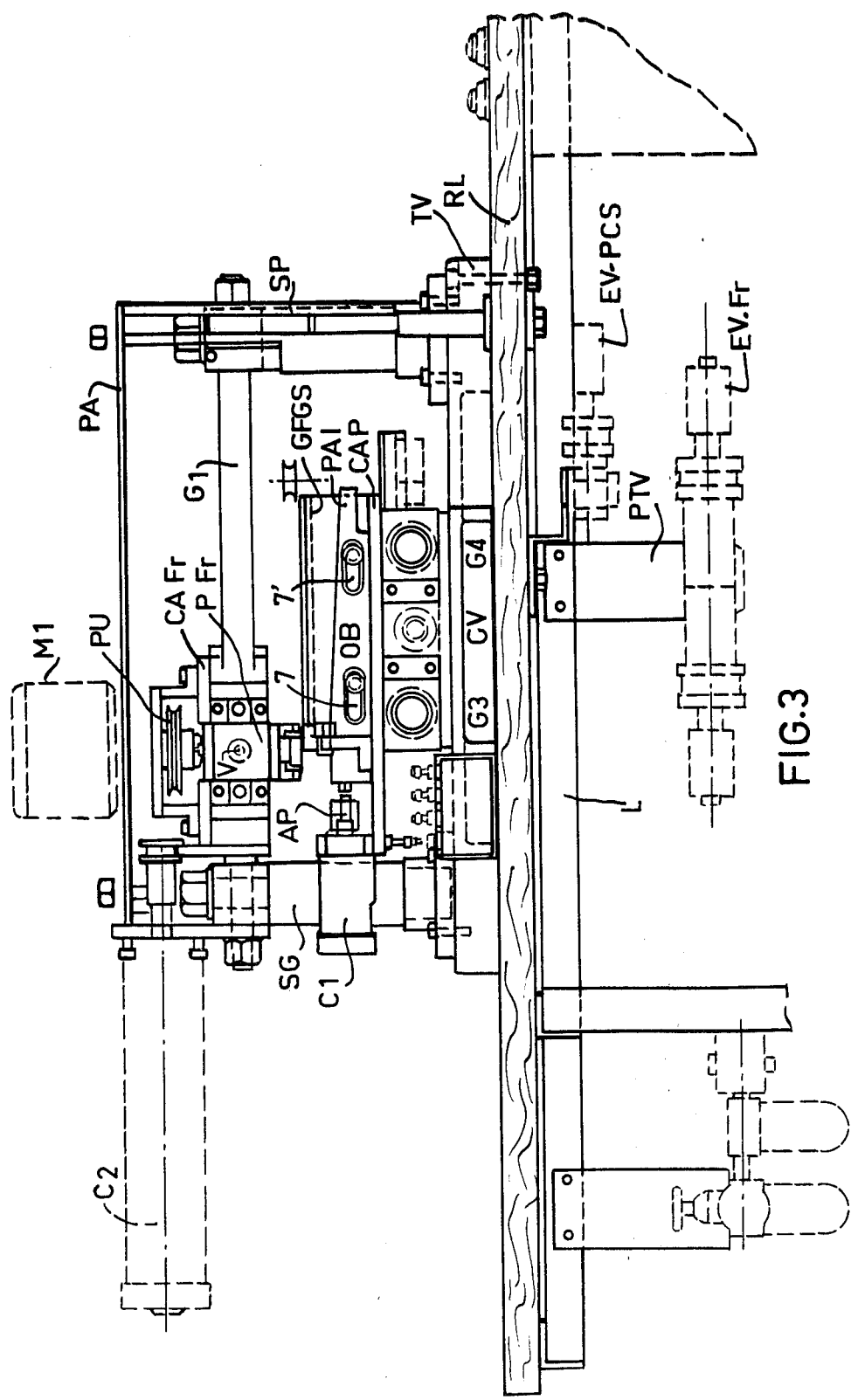
FIG. 3 shows one recommended embodiment of the machine represented in FIG. 2.
Figure 4:
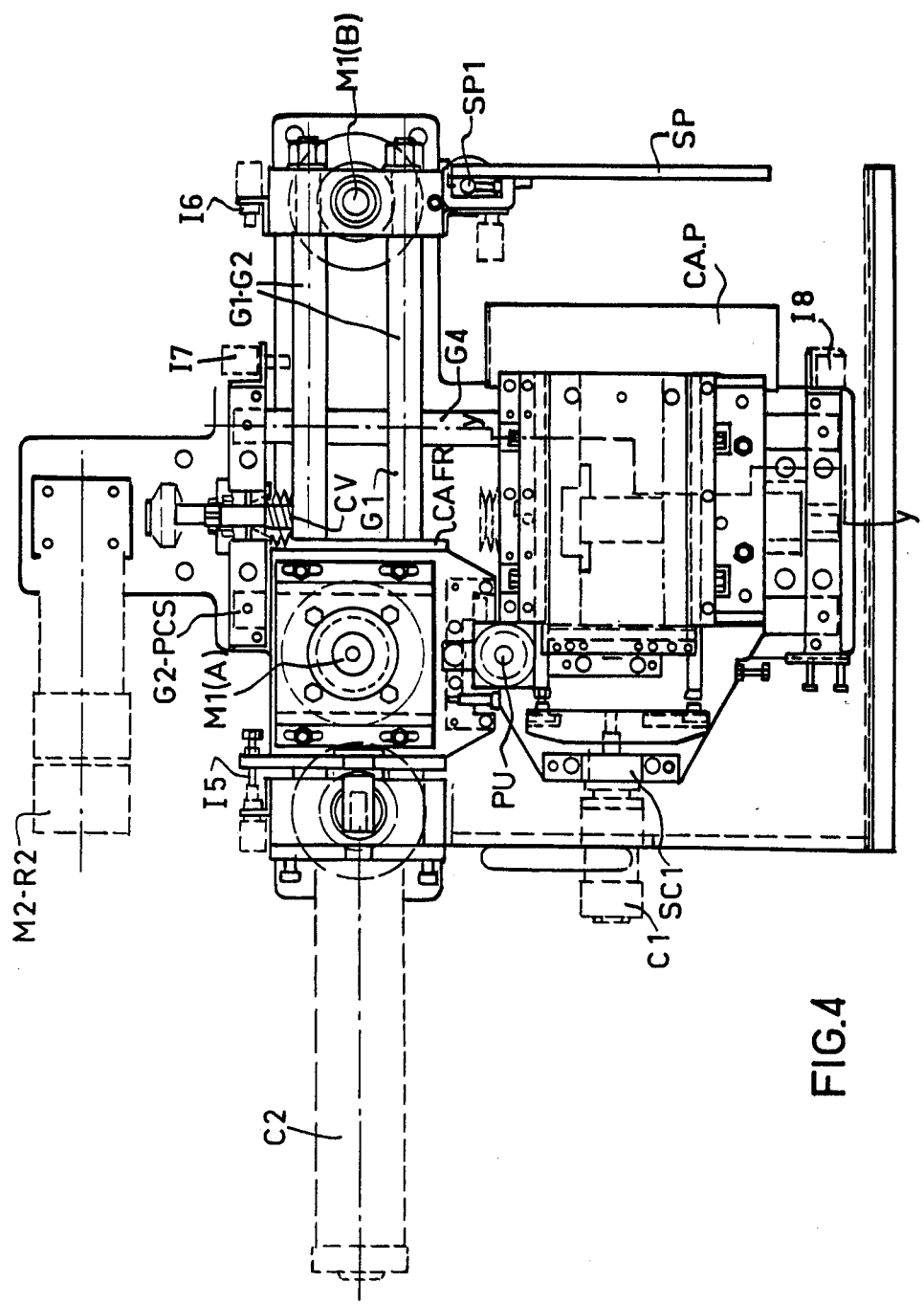
FIG. 4 shows, in diagrammatical form, the upper part of the machine represented in FIG. 3.

FIGS. 3 and 4 show one recommended embodiment of the machine represented in FIG. 2. FIG. 3 is a partial cross-sectional side view, showing a base TV on a wooden plank RL mounted on L-sections. The milling-cutter electrovalve EV.Fr is attached to one leg $P_{TV}$ of the base. The carriage CA.P provides a sloping surface PAI, which slides on two rails 7 and 7', when the cylinder $C_1$ and piston rod AP pass from one end position to the other, moving the locking device (OB in FIG. 2) and blocking the plate after the gate SP has been shut. This carriage CA.P is moved by the motor-reduction unit $M_2$-$R_2$ (not shown here), by means of the screw CV, and it slides along the two rails G and G parallel to the shaft (AAP on FIG. 2), driving this screw. The cylinder $C_1$ is attached to a support SG.

FIG. 3 shows that the whole unit constituting the body of carriage CA.P which bears the plate is placed beneath the cutter carriage CA.Fr.

The part of the machine connected to the cutter Fr comprises a cutter-holder P.Fr, pulley PU and motor $M_1$, all these components being aligned along a vertical axis YY.

Consequently, when the motor $M_1$ is started, the pulley PU operating the cutter Fr rotates at a fairly high speed.

The cutter Fr is carried by the cutter-holder P.Fr mounted in the vertical axis YY, and its position can be adjusted by means of a screw V, allowing it to be positioned in relation to the plate PCS, placed on the guide-component GPCS of the carriage CA.P.

Thus the plate is in a fixed position on the guide-components GPCS, while the position of the cutter Fr on its supporting carriage CA.Fr can be adjusted in relation to the plate PCS, by means of the screw V, depending on the final distance the conductors are to project from the printed-circuit plate.

For maximum smoothing, the screw V is adjusted so that the cutter Fr is in its lowest position; in this case, conductors will project 0.8 mm from the surface of the plate after smoothing. In the other extreme, the screw V can be adjusted so that the cutter Fr is in its highest position; in this case, conductors will project 1.6 mm.

FIG. 3 shows only the guide component $G_1$ of the cutter carriage CA.Fr Forward or backward movement of this carriage on guide components $G_1$ and $G_2$ is controlled by the jack $C_2$ which, as the figure shows, is placed parallel to guide component $G_1$, but in an orthogonal position in relation to axis YY.

FIG. 4 shows, in diagrammatical form, the upper part of the machine represented in FIG. 3, partially in cross-section, illustrating certain details. Similar or identical parts bear the same reference. It is unnecessary to describe the construction of this machine in detail, since it will be familiar to anyone skilled in the art.

It should be noted, however, that FIGS. 3 and 4 illustrate the compactness and general layout of the machine according to the invention.

FIG. 4 shows the layout of the motor-reduction unit $M_2$-$R_2$ driving the screw CV, the geometrical axis of which is at an angle of 90° to the axis of the reduction unit. The guide component $G_4$ along which the carriage CA.P with the plate moves is parallel to the shaft driving the screw CV.

The figure also shows limit microswitches I.9 and I.7 associated to the carriage CA.P.

The cutter $M_1$ and carriage CA.Fr are shown in their initial position A (see FIG. 1) and also in their end position B, at the other end of guide members $G_1$ and $G_2$. Microswitches I.5 and I.6 (see also FIG. 2) indicate the end positions of the carriage CA.Fr.

The gate SP opens by pivoting outwards 90° about the axis SP 1°.

In FIG. 3, the top part of the machine is closed by a component PA, to prevent accidents.

In one particularly useful practical application, printed-circuit plates measuring 85 × 180 mm or 105 × 108 mm are smoothed using a machine with the following five units:

milling-cutter motor and shaft (2800 rpm);
motor-reduction unit (170 rpm) to move the carriage carrying the plate by means of an endless screw;
pneumatic jack $C_1$ to hold the plate automatically on its carriage;
jack $C_2$ to move the cutter;
control board.

The cycle lasts from 15 to 50 seconds, and preferably 25 seconds. Current supplying the two electric motors is 380V/50Hz, and for the electropneumatic components it is 24 V 50 Hz. Pneumatic components operate at a pressure of 6 kg/cm$^2$ (power input being 0.35 hp).

The height of projection of conductors beyond the plate surface can be adjusted as required, if necessary continuously to any value between 0.8 and 1.6 mm and can be adjusted gradually.

It will be understood that this invention is not confined to the embodiments described and illustrated: many modifications can be made by those skilled in the art, depending on applications involved, without any departure from the spirit of the invention.

What is claimed is:

1. A machine for cutting off wires permanently secured to a printed circuit board and having free ends extending from one side of said board, said machine comprising at least one smoothing tool consisting of a milling-cutter revolving at high speed, and means for moving the printed-circuit board, said machine further comprising:

a multi-component device including a first screw-driven carriage for moving the board in a transverse direction in relation to a lengthwise axis of the board, and in the same plane as that of the board, a device including a pneumatically controllable carriage for imparting a translational travelling movement to the smoothing tool along the lengthwise axis of the board to sever said wires, said cutter passing within a distance of less than 1.6 mm. of said one side of said board, a control device coupled to the board-moving device, to control transverse movements of the board and initiate the lengthwise movement of the smoothing tool on completion of each transverse movement of the board, reversing means responsive to completion of each lengthwise movement of the smoothing tool, for causing an incremental transverse movement of the board and a lengthwise movement of the smoothing tool on completion of the incremental transverse movement of the board, said lengthwise movement of the smoothing tool taking place in the direction opposite to that of the previous lengthwise movement, means for disposing the board on the transverse-movement device, locking the board in position and initiating the first transverse movement of the board, said locking means comprising a pneumatic jack for holding the board on said first carriage, said locking device comprising a sloping surface and being coupled to said holding jack for immobilizing the board on the first carriage when the holding jack is operated to move the locking device in a predetermined direction, means for causing the components forming the board-moving device to return to the original positions thereof on completion of a series of said transverse movements, and switch means for stopping the machine when a protective cover is removed, to prevent accidents.

* * * * *